(12) United States Patent
Zhang et al.

(10) Patent No.: US 11,587,913 B2
(45) Date of Patent: Feb. 21, 2023

(54) LIGHT EMITTING DIODE PACKAGE STRUCTURE

(71) Applicant: KAISTAR Lighting(Xiamen) Co., Ltd., Xiamen (CN)

(72) Inventors: Jing-Qiong Zhang, Xiamen (CN); Tsung-Chieh Lin, Xiamen (CN)

(73) Assignee: KAISTAR LIGHTING(XIAMEN) CO., LTD., Xiamen (CN)

( * ) Notice: Subject to any disclaimer, the term of this patent is extended or adjusted under 35 U.S.C. 154(b) by 160 days.

(21) Appl. No.: 17/169,632

(22) Filed: Feb. 8, 2021

(65) Prior Publication Data

US 2021/0167049 A1     Jun. 3, 2021

(30) Foreign Application Priority Data

May 8, 2020   (CN) .......................... 202010390155.6

(51) Int. Cl.
*H01L 25/075*   (2006.01)
*H01L 33/48*    (2010.01)
*H01L 33/62*    (2010.01)

(52) U.S. Cl.
CPC ........ *H01L 25/0753* (2013.01); *H01L 33/486* (2013.01); *H01L 33/62* (2013.01)

(58) Field of Classification Search
CPC ............. F21K 9/00; F21K 9/90; H01L 33/504
See application file for complete search history.

(56) References Cited

U.S. PATENT DOCUMENTS

| | | | |
|---|---|---|---|
| 2012/0262903 A1* | 10/2012 | Li .............................. | F21V 9/32 362/231 |
| 2016/0254421 A1* | 9/2016 | Reiherzer ........... | H01L 25/0753 257/89 |
| 2018/0012874 A1* | 1/2018 | Bergmann .............. | H01L 33/62 |
| 2022/0272806 A1* | 8/2022 | Petluri .................. | A61M 21/02 |

\* cited by examiner

*Primary Examiner* — Andrew J Coughlin
(74) *Attorney, Agent, or Firm* — Li & Cai Intellectual Property (USA) Office

(57) ABSTRACT

A light emitting diode package structure is provided. The light emitting diode package structure includes first and second chips. A value of an intensity of a peak wavelength of a first shoulder wave of the first chip divided by an intensity of a peak wavelength of a first main wave of the first chip is defined as a first intensity ratio. A value of an intensity of a peak wavelength of a second shoulder wave of the second chip divided by an intensity of a peak wavelength of a second main wave of the second chip is defined as a second intensity ratio. The first and second chips satisfy "a difference between the intensities of the peak wavelengths of the first and second main waves being less than or equal to 2.5 nanometers" and "a difference between the first and second intensity ratios being greater than 0.1".

20 Claims, 5 Drawing Sheets

LIGHT EMITTING DIODE PACKAGE STRUCTURE

CROSS-REFERENCE TO RELATED PATENT APPLICATION

This application claims the benefit of priority to China Patent Application No. 202010390155.6, filed on May 8, 2020 in People's Republic of China. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a package structure, and more particularly to a light emitting diode package structure.

BACKGROUND OF THE DISCLOSURE

A conventional light emitting diode includes a plurality of broadband chips. Since the broadband chips have different quantum wells (i.e., QW), an energy band gap (i.e., Eg) between the different quantum wells is different. When an electron is electrically recombined, the energy of recombination for different energy band gaps is different. The result is that a spectrum of any one of the broadband chips produced in the same batch is different from that of another one of the broadband chips produced in the same batch. In order to ensure that all of the spectrums of each of the products (i.e., the conventional light emitting diodes) are consistent with each other and meet qualified specifications, a manufacturer will only select the broadband chips that meet the qualified specifications to manufacture the products. Therefore, the aforementioned method leads to low utilization rate of the broadband chips and increases overall manufacturing costs.

SUMMARY OF THE DISCLOSURE

In response to the above-referenced technical inadequacies, the present disclosure provides a light emitting diode package structure to effectively improve on issues associated with the conventional light emitting diodes.

In one aspect, the present disclosure provides a light emitting diode package structure. The light emitting diode package structure includes a first chip, a second chip, and a package body. The first chip has a first main wave and a first shoulder wave on a broad-band blue light spectrum. A peak wavelength of the first main wave has an intensity and a peak wavelength of the first shoulder wave has an intensity that is lower than the intensity of the peak wavelength of the first main wave. A value derived from dividing the intensity of the peak wavelength of the first shoulder wave by the intensity of the peak wavelength of the first main wave is defined as a first intensity ratio. A broad-band blue light spectrum of a light generated by the second chip is different from the broad-band blue light spectrum of a light generated by the first chip, and the second chip has a second main wave and a second shoulder wave on the broad-band blue light spectrum. A peak wavelength of the second main wave has an intensity, and a peak wavelength of the second shoulder wave has an intensity that is lower than the intensity of the peak wavelength of the second main wave. A value derived from dividing the intensity of the peak wavelength of the second shoulder wave by the intensity of the peak wavelength of the second main wave is defined as a second intensity ratio. The package body covers the first chip and the second chip. The light generated by the first chip and the light generated by the second chip are mixed and pass through the package body so as to generate a beam. Each of the first chip and the second chip is configured to satisfy a first condition and a second condition. The first condition is that when a difference between the peak wavelength of the first main wave and the peak wavelength of the second main wave is less than or equal to 2.5 nanometers, the peak wavelength of the first main wave and the peak wavelength of the second main wave are defined as being similar to each other. The second condition is that when a difference between the first intensity ratio and the second intensity ratio is greater than 0.1, the first intensity ratio and the second intensity ratio are defined as being dissimilar to each other. A full width at half maximum (FWHM) of the beam is within a range from an FWHM of the first chip to an FWHM of the second chip.

In another aspect, the present disclosure provides a light emitting diode package structure. The light emitting diode package structure includes a first chip, a second chip, and a package body. The first chip has a first main wave and a first shoulder wave on a broad-band blue light spectrum. A peak wavelength of the first main wave has an intensity, and a peak wavelength of the first shoulder wave has an intensity that is lower than the intensity of the peak wavelength of the first main wave. A value derived from dividing the intensity of the peak wavelength of the first shoulder wave by the intensity of the peak wavelength of the first main wave is defined as a first intensity ratio. A broad-band blue light spectrum of a light generated by the second chip is different from the broad-band blue light spectrum of a light generated by the first chip, and the second chip has a second main wave and a second shoulder wave on the broad-band blue light spectrum. A peak wavelength of the second main wave has an intensity, and a peak wavelength of the second shoulder wave has an intensity that is lower than the intensity of the peak wavelength of the second main wave. A value derived from dividing the intensity of the peak wavelength of the second shoulder wave by the intensity of the peak wavelength of the second main wave is defined as a second intensity ratio. The package body covers the first chip and the second chip. The light generated by the first chip and the light generated by the second chip are mixed and pass through the package body so as to generate a beam. Each of the first chip and the second chip is configured to satisfy a first condition and a second condition. The first condition is that when a difference between the peak wavelength of the first main wave and the peak wavelength of the second main wave is greater than 2.5 nanometers, the peak wavelength of the first main wave and the peak wavelength of the second main wave are defined as being dissimilar to each other. The second condition is that when a difference between the first intensity ratio and the second intensity ratio is less than or equal to 0.2, the first intensity ratio and the second intensity ratio are defined as being similar to each other. A full width at half maximum (FWHM) of the beam is at least greater than an FWHM of the first chip or an FWHM of the second chip.

In yet another aspect, the present disclosure provides a light emitting diode package structure. The light emitting diode package structure includes a first chip, a second chip, and a package body. The first chip has a first main wave and a first shoulder wave on a broad-band blue light spectrum. A peak wavelength of the first main wave has an intensity, and a peak wavelength of the first shoulder wave has an intensity that is lower than the intensity of the peak wavelength of the first main wave. A value derived from dividing the intensity of the peak wavelength of the first shoulder wave by the intensity of the peak wavelength of the first main wave is defined as a first intensity ratio. A broad-band blue light spectrum of a light generated by the second chip is different from the broad-band blue light spectrum of a light generated by the first chip, and the second chip has a second main wave and a second shoulder wave on the broad-band blue light spectrum. A peak wavelength of the second main wave has an intensity, and a peak wavelength of the second shoulder wave has an intensity that is lower than the intensity of the peak wavelength of the second main wave. A value derived from dividing the peak wavelength of the second shoulder wave by the intensity of the peak wavelength of the second main wave is defined as a second intensity ratio. The package body covers the first chip and the second chip. The light generated by the first chip and the light generated by the second chip are mixed and pass through the package body so as to generate a beam. Each of the first chip and the second chip is configured to satisfy a first condition and a second condition. The first condition is that when a difference between the peak wavelength of the first main wave and the peak wavelength of the second main wave is greater than 2.5 nanometers, the peak wavelength of the first main wave and the peak wavelength of the second main wave are defined as being dissimilar to each other. The second condition is that when a difference between the first intensity ratio and the second intensity ratio is greater than 0.1, the first intensity ratio and the second intensity ratio are defined as being dissimilar to each other. A full width at half maximum (FWHM) of the beam is at least greater than an FWHM of the first chip or an FWHM of the second chip.

In still yet another aspect, the present disclosure provides a light emitting diode package structure. The light emitting diode package structure includes a first chip, a second chip, and a package body. The first chip has a first main wave and a first shoulder wave on a broad-band blue light spectrum. A peak wavelength of the first main wave has an intensity, and a peak wavelength of the first shoulder wave has an intensity that is lower than the intensity of the peak wavelength of the first main wave. A value derived from dividing the intensity of the peak wavelength of the first shoulder wave by the intensity of the peak wavelength of the first main wave is defined as a first intensity ratio. A broad-band blue light spectrum of a light generated by the second chip is different from the broad-band blue light spectrum of a light generated by the first chip, and the second chip has a second main wave and a second shoulder wave on the broad-band blue light spectrum. A peak wavelength of the second main wave has an intensity, and a peak wavelength of the second shoulder wave has an intensity that is lower than the intensity of the peak wavelength of the second main wave. A value derived from dividing the intensity of the peak wavelength of the second shoulder wave by the intensity of the peak wavelength of the second main wave is defined as a second intensity ratio. The package body covers the first chip and the second chip. The light generated by the first chip and the light generated by the second chip are mixed and pass through the package body so as to generate a beam. Each of the first chip and the second chip is configured to at least satisfy a first condition or a second condition. The first condition is that when a difference between the peak wavelength of the first main wave and the peak wavelength of the second main wave is greater than 2.5 nanometers, the peak wavelength of the first main wave and the peak wavelength of the second main wave are defined as being dissimilar to each other. The second condition is that a difference between the first intensity ratio and the second intensity ratio is used to determine that the first intensity ratio and the second intensity ratio are dissimilar to each other based on a determination principle.

Therefore, by virtue of "two non-compliant chips (i.e., the first chip and the second chip) that satisfy the first condition and the second condition being grouped together", all the spectrums of each of the beams generated by the light emitting diode package structures of the present disclosure are consistent with each other and the spectrums of the beams are in compliance with qualified specifications. Accordingly, a utilization rate of chips during manufacturing can be increased, and manufacturing costs can be reduced.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings in which.

DETAILED DESCRIPTION OF THE EXEMPLARY EMBODIMENTS

Figure 1:
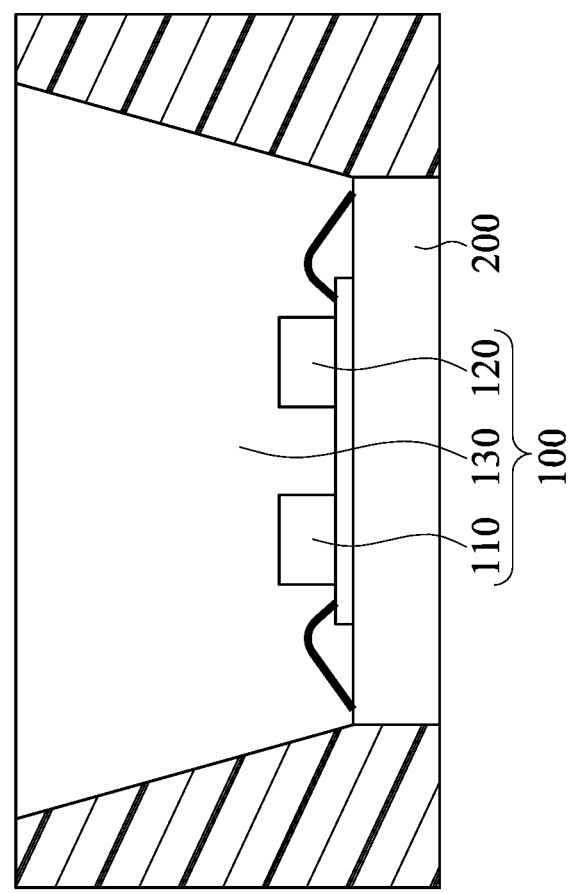
FIG. 1 is a cross-sectional schematic view of a light emitting diode package structure according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

The present disclosure provides a light emitting diode package structure 1000. FIG. 1 to FIG. 5 show various embodiments based on an inventive concept of the present disclosure. First of all, the following describes the inventive concept of the present disclosure. Reference is made to FIG. 1, which shows a cross-sectional schematic view of the light emitting diode package structure 1000 in the present disclosure. The light emitting diode package body structure 1000 includes a substrate 200, a first chip 110 disposed on the substrate 200, a second chip 120 disposed on the substrate 200, a package body 130 covering the first chip 110 and the second chip 120, and a sidewall that is disposed on the substrate 200. The first chip 110, the second chip 120, and the package body 130 are jointly defined as a light emitting component 100. A light generated by the first chip 110 and a light generated by the second chip 120 respectively correspond to broad-band blue light spectrums that are different from each other. In other words, any light emitting diode package structure composed of two chips that have the same broad-band blue light spectrums is not the light emitting diode package structure 1000 of the present disclosure.

The first chip 110 has a first main wave MW1 and a first shoulder wave SW1 on a broad-band blue light spectrum. A peak wavelength MP1 of the first main wave MW1 has an intensity, and a peak wavelength SP1 of the first shoulder wave SW1 has an intensity that is lower than the intensity of the peak wavelength MP1 of the first main wave MW1. A value derived from dividing the intensity of the peak wavelength SP1 of the first shoulder wave SW1 by the intensity of the peak wavelength MP1 of the first main wave MW1 is defined as a first intensity ratio. It should be noted that in another embodiment of the present disclosure that is not shown, the intensity of the peak wavelength SP1 of the first shoulder wave SW1 can also be replaced with an inflection point of the first shoulder wave SW1.

The second chip 120 has a second main wave MW2 and a second shoulder wave SW2 on a broad-band blue light spectrum. A peak wavelength MP2 of the second main wave MW2 has an intensity, and a peak wavelength SP2 of the second shoulder wave SW2 has an intensity that is lower than the intensity of the peak wavelength MP2 of the second main wave MW2. A value derived from dividing the intensity of the peak wavelength SP2 of the second shoulder wave SW2 by the intensity of the peak wavelength MP2 of the second main wave MW2 is defined as a second intensity ratio. It should be noted that in another embodiment of the present disclosure that is not shown, the intensity of the peak wavelength SP2 of the second shoulder wave SW2 can also be replaced with an inflection point of the second shoulder wave SW2.

Furthermore, after the intensity of the first chip 110 and the intensity of the second chip 120 are normalized on the broad-band blue light spectrum, there is a difference between a waveform of the first chip 110 and a waveform of the second chip 120. The difference is at least "the first intensity ratio being different from the second intensity ratio" or "the peak wavelength MP1 of the first main wave MW1 being different from the peak wavelength MP2 of the second main wave MW2".

The light generated by the first chip 110 and the light generated by the second chip 120 are mixed and pass through a phosphor of the package body 130, so as to generate a beam. The beam has a beam main wave MWL and a beam shoulder wave SWL on the broad-band blue light spectrum. A peak wavelength MPL of the beam main wave MWL has an intensity, and a peak wavelength SPL of the beam shoulder wave SWL has an intensity that is lower than the intensity of the peak wavelength MPL of the beam main wave MWL. A value derived from dividing the intensity of the peak wavelength SPL of the beam shoulder wave SWL by the intensity of the peak wavelength MPL of the beam main wave MWL is defined as a beam intensity ratio. It should be noted that in another embodiment of the present disclosure that is not shown, the intensity of the peak wavelength SPL of the beam shoulder wave SWL can also be replaced with an inflection point of the beam shoulder wave SWL.

In order to ensure that all the spectrums of each of the beams are consistent with each other and meet qualified specifications, each of the first chip 110 and the second chip 120 must at least satisfy a first condition or a second condition.

The first condition is that when a difference between the peak wavelength MP1 of the first main wave MW1 and the peak wavelength MP2 of the second main wave MW2 is greater than 2.5 nanometers, the peak wavelength MP1 of the first main wave MW1 and the peak wavelength MP2 of the second main wave MW2 are defined as being dissimilar to each other. The second condition is that a difference between the first intensity ratio and the second intensity ratio is used to determine whether the first intensity ratio and the second intensity ratio are dissimilar to each other based on a determination principle.

In detail, when each of the first chip 110 and the second chip 120 does not satisfy the first condition, each of the first chip 110 and the second chip 120 will satisfy the second condition. The determination principle is that the difference between the first intensity ratio and the second intensity ratio is greater than 0.1, and the first intensity ratio and the second intensity ratio are defined as being dissimilar to each other. The beam intensity ratio is within a range from the first intensity ratio to the second intensity ratio, and a full width at half maximum (FWHM) of the beam is within a range from an FWHM of the first chip 110 to an FWHM of the second chip 120.

When each of the first chip 110 and the second chip 120 satisfies the first condition, each of the first chip 110 and the second chip 120 needs to further satisfy an advanced condition. The advanced condition can be that the difference between the first intensity ratio and the second intensity ratio is less than or equal to 0.2, so that the FWHM of the beam is at least greater than the FWHM of the first chip 110 or the FWHM of the second chip 120. The advanced condition can also be that the difference between the first intensity ratio and the second intensity ratio is greater than 0.1, so that the intensity of the peak wavelength MPL of the beam main wave MWL is within a range from the intensity of the peak wavelength MP1 of the first main wave MW1 to the intensity of the peak wavelength MP2 of the second main wave MW2, and the FWHM of the beam is at least greater than the FWHM of the first chip 110 or the FWHM of the second chip 120.

Based on the above-mentioned inventive concept, the first chip 110 and the second chip 120 of the present disclosure can have many embodiments that satisfy the first condition and the second condition. The following provides four embodiments for description.

First Embodiment

Figure 2:
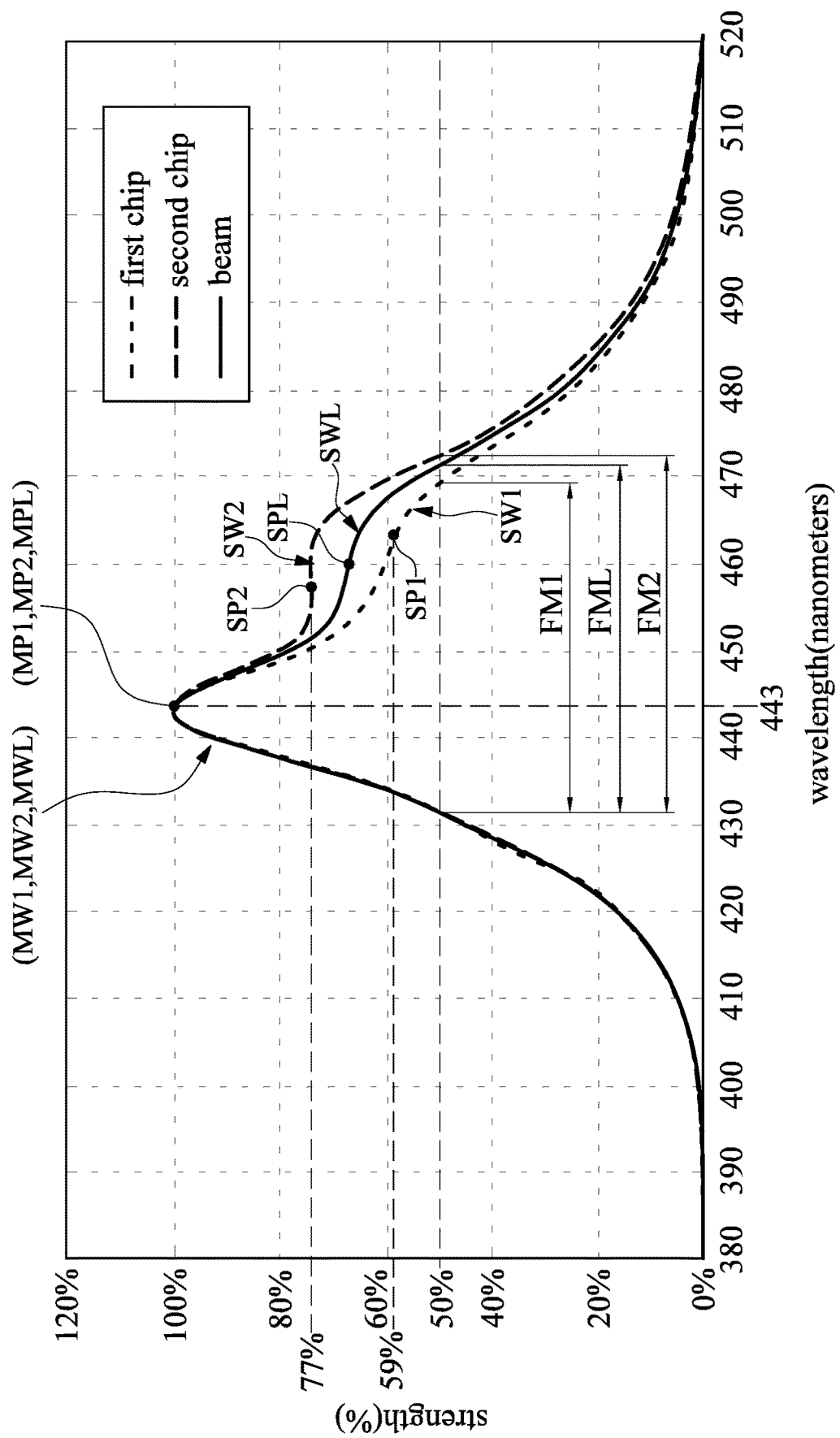
FIG. 2 is a diagram showing each of a light generated by a first chip, a light generated by a second chip, and a beam in a corresponding broad-band blue light spectrum according to the first embodiment of the present disclosure.

Referring to FIG. 1 and FIG. 2, a first embodiment of the present disclosure provides a light emitting diode package structure 1000. The light emitting diode package structure 1000 includes a first chip 110 disposed on a substrate 200, a second chip 120 disposed on the substrate 200, a package body 130 covering the first chip 110 and the second chip 120, and a sidewall that is disposed on the substrate 200. A beam is generated when the light generated by the first chip 110 and the light generated by the second chip 110 pass through a phosphor of the package body 130. In order to ensure that all the spectrums of each of the beams are consistent with each other and meet the qualified specification. Therefore, each of the first chip 110 and the second chip 120 is configured to satisfy a first condition and a second condition at the same time.

The first condition is that when a difference between the peak wavelength MP1 of the first main wave MW1 and the peak wavelength MP2 of the second main wave MW2 is less than or equal to 2.5 nanometers, the peak wavelength MP1 of the first main wave MW1 and the peak wavelength MP2 of the second main wave MW2 are defined as being similar to each other. The second condition is that when a difference between the first intensity ratio and the second intensity ratio is greater than 0.1, the first intensity ratio and the second intensity ratio are defined as being dissimilar to each other.

In other words, the peak wavelength MP1 of the first main wave MW1 of the first chip 110 and the peak wavelength MP2 of the second main wave MW2 of the second chip 120 must be similar to each other, which is to satisfy the first condition. The first intensity ratio of the first chip 110 and the second intensity ratio of the second chip 120 must be dissimilar to each other, which is to satisfy the second condition.

When each of the first chip 110 and the second chip 120 satisfies the first condition and the second condition, an FWHM FML of the beam is within a range from an FWHM FM1 of the first chip 110 to an FWHM FM2 of the second chip 120.

For the convenience of description, an example will be given below, but the present disclosure is not limited thereto. Reference is made to FIG. 2, which is a waveform diagram showing each of a light generated by the first chip 110, a light generated by the second chip 120, and the beam generated by the mixing of the light generated by the first chip 110 and the light generated by the second chip 120 that meet the first condition and the second condition in a corresponding broad-band blue light spectrum. The horizontal axis of the diagram is wavelength (nm), and the vertical axis of the diagram is intensity (%).

Referring to FIG. 2, the FWHM FML of the beam is within a range from the FWHM FM1 of the first chip 110 to the FWHM FM2 of the second chip 120. When the wavelengths in FIG. 2 are within a range from 380 to 450 nanometers, the waveform of the first chip 110 is similar to that of the second chip 120, and the peak wavelength MP1 of the first chip 110 and the peak wavelength MP2 of the second chip 120 are approximately 443 nanometers. In other words, a waveform of the beam mixed by the light generated by the first chip 110 and the light generated by the second chip 120 is similar to the waveform of the first chip 110 and the waveform of the second chip 120. Further, the peak wavelength MPL of the beam main wave MWL is also 443 nanometers.

When the wavelengths in FIG. 2 are within a range from 445 to 475 nanometers, a first shoulder wave SW1 of the first chip 110 and a second shoulder wave SW2 of the second chip 120 each are located in a section that is within a range from 445 to 475 nanometers. That is, the peak wavelength SP1 of the first shoulder wave SW1 and the peak wavelength SP2 of the second shoulder wave SW2 are each within a range 445 to 475 nanometers. The intensity of the first shoulder wave SW1 and the second intensity ratio of the second shoulder wave SW2 are each within a range from 30% to 90%, and the intensity of the peak wavelength SPL of the beam shoulder wave SWL is within a range from the intensity of the peak wavelength SP1 of the first shoulder wave SW1 to the intensity of the peak wavelength SP2 of the second shoulder wave SW2.

Referring to FIG. 2, the intensity of the peak wavelength SP1 of the first shoulder wave SW1 is approximately 59%, and the intensity of the peak wavelength MP1 of the first main wave MW1 is 100%, so that the first intensity ratio is 0.59. The intensity of the peak wavelength SP2 of the second shoulder wave SW2 is approximately 77%, and the intensity of the peak wavelength MP2 of the second main wave MW2 is 100%, so that the second intensity ratio is 0.77. The difference between the first intensity ratio and the second intensity ratio is 0.18, which is greater than 0.1. Therefore, according to the second condition, the first intensity ratio and the second intensity ratio are defined as being dissimilar to each other. In addition, the first intensity ratio and the second intensity ratio are each within a range from 30% to 90%, that is, within a range from 0.3 and 0.9. Further, when the wavelength in FIG. 2 is 460 nanometers, the difference between the intensity of the peak wavelength SP1 of the first shoulder wave SW1 and the intensity of the peak wavelength SP2 of the second shoulder wave SW2 is the greatest and is approximately 15%.

After the wavelength in FIG. 2 is greater than 475 nanometers, the waveform of the first chip 110 gradually coincides with the waveform of the second chip 120. In other words, the waveform of the beam will also be consistent with the waveform of the first chip 110 and the waveform of the second chip 120.

Second Embodiment

Figure 3:
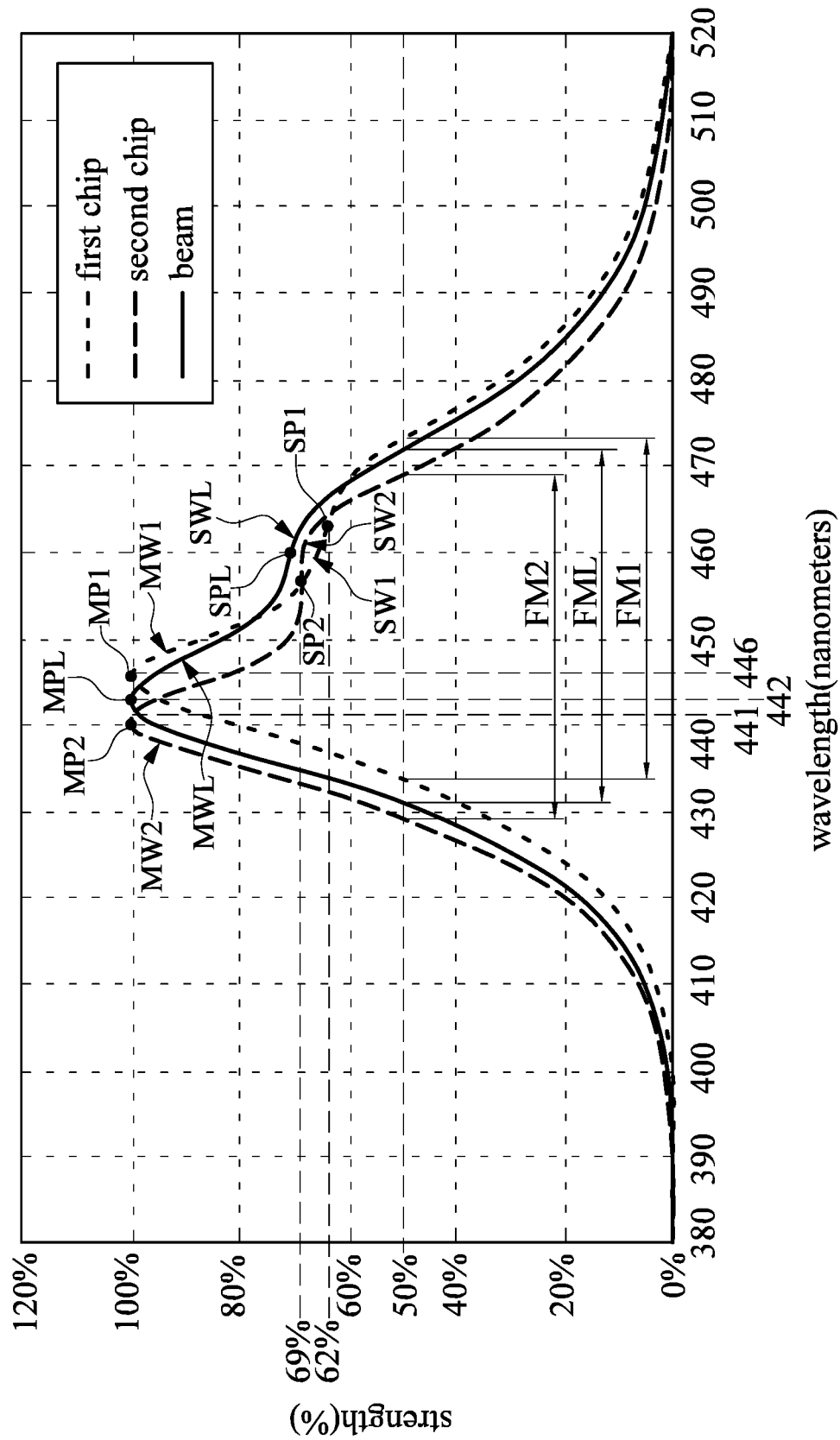
FIG. 3 is a diagram showing each of a light generated by the first chip, a light generated by the second chip, and a beam in a corresponding broad-band blue light spectrum according to a second embodiment of the present disclosure.

Referring to FIG. 3, the present embodiment is similar to the first embodiment, and the similarities between the present embodiment and the first embodiment will not be repeated herein. The differences of the present embodiment from the first embodiment are mainly as follows.

The first condition and the second condition in the present embodiment are different from the first embodiment. The first condition in the present embodiment is that when a difference between the peak wavelength MP1 of the first main wave MW1 and the peak wavelength MP2 of the second main wave MW2 is greater than 2.5 nanometers, the peak wavelength MP1 of the first main wave MW1 and the peak wavelength MP2 of the second main wave MW2 are defined as being dissimilar to each other. The second condition in the present embodiment is that when a difference between the first intensity ratio and the second intensity ratio is less than or equal to 0.2, the first intensity ratio and the second intensity ratio are defined as being similar to each other. In addition, when each of the first chip 110 and the second chip 120 satisfies the first condition and the second condition, the FWHM FML of the beam is at least greater than the FWHM FM1 of the first chip 110 or the FWHM FM2 of the second chip 120.

For the convenience of description, an example will be given below, but the present disclosure is not limited thereto. Reference is made to FIG. 3, which is a waveform diagram showing each of a light generated by the first chip 110, a light generated by the second chip 120, and the beam generated by the mixing of the light generated by the first chip 110 and the light generated by the second chip 120 that meet the first condition and the second condition in a corresponding broad-band blue light spectrum. The horizontal axis of the diagram is wavelength (nm), and the vertical axis of the diagram is intensity (%).

Referring to FIG. 3, when each of the first chip 110 and the second chip 120 satisfies the first condition and the second condition, the FWHM FML of the beam is significantly greater than the FWHM FM1 of the first chip 110, and the peak wavelength SPL of the beam shoulder wave SWL is greater than the peak wavelength SP1 of the first shoulder wave SW1 and the peak wavelength SP2 of the second shoulder wave SW2. When the peak wavelength MP1 of the first chip 110 and the peak wavelength MP2 of the second chip 120 each are located in a section that is within a range from 430 to 455 nanometers, the peak wavelength MP1 of the first main wave MW1 is approximately 446 nanometers, and the peak wavelength MP2 of the second main wave MW2 is approximately 441 nanometers. A difference between the peak wavelength MP1 of the first main wave MW1 and the peak wavelength MP2 of the second main wave MW2 is 5 nanometers, which is greater than 2.5 nanometers. In other words, the peak wavelength MP1 of the first main wave MW1 and the peak wavelength MP2 of the second main wave MW2 are defined as being similar to each other according to the first condition. In addition, the peak wavelength MPL of the beam is 442 nanometers, that is, the peak wavelength MPL of the beam is within a range from the peak wavelength MP1 of the first main wave MW1 to the peak wavelength MP2 of the second main wave MW2.

When the first shoulder wave SW1 and the second shoulder wave SW2 are approximately within a range from 445 to 475 nanometers, the intensity of the first shoulder wave SW1 and the intensity of the second shoulder wave SW2 are each within a range from 30% to 90%. In detail, the intensity of the peak wavelength SP1 of the first shoulder wave SW1 is approximately 62%, the intensity of the peak wavelength MP1 of the first main wave MW1 is 100%, the intensity of the peak wavelength SP2 of the second shoulder wave SW2 is approximately 69%, and the intensity of the peak wavelength MP2 of the second main wave MW2 is 100%. In other words, the first intensity ratio is 0.62 and the second intensity ratio is 0.69, so that the difference between the first intensity ratio and the second intensity ratio is 0.07, which is less than or equal to 0.2. Therefore, according to the second condition, the first intensity ratio and the second intensity ratio are defined as being similar to each other. In addition, the first intensity ratio and the second intensity ratio are each within a range from 30% to 90%, that is, within a range from 0.3 to 0.9.

Third Embodiment

Figure 4:
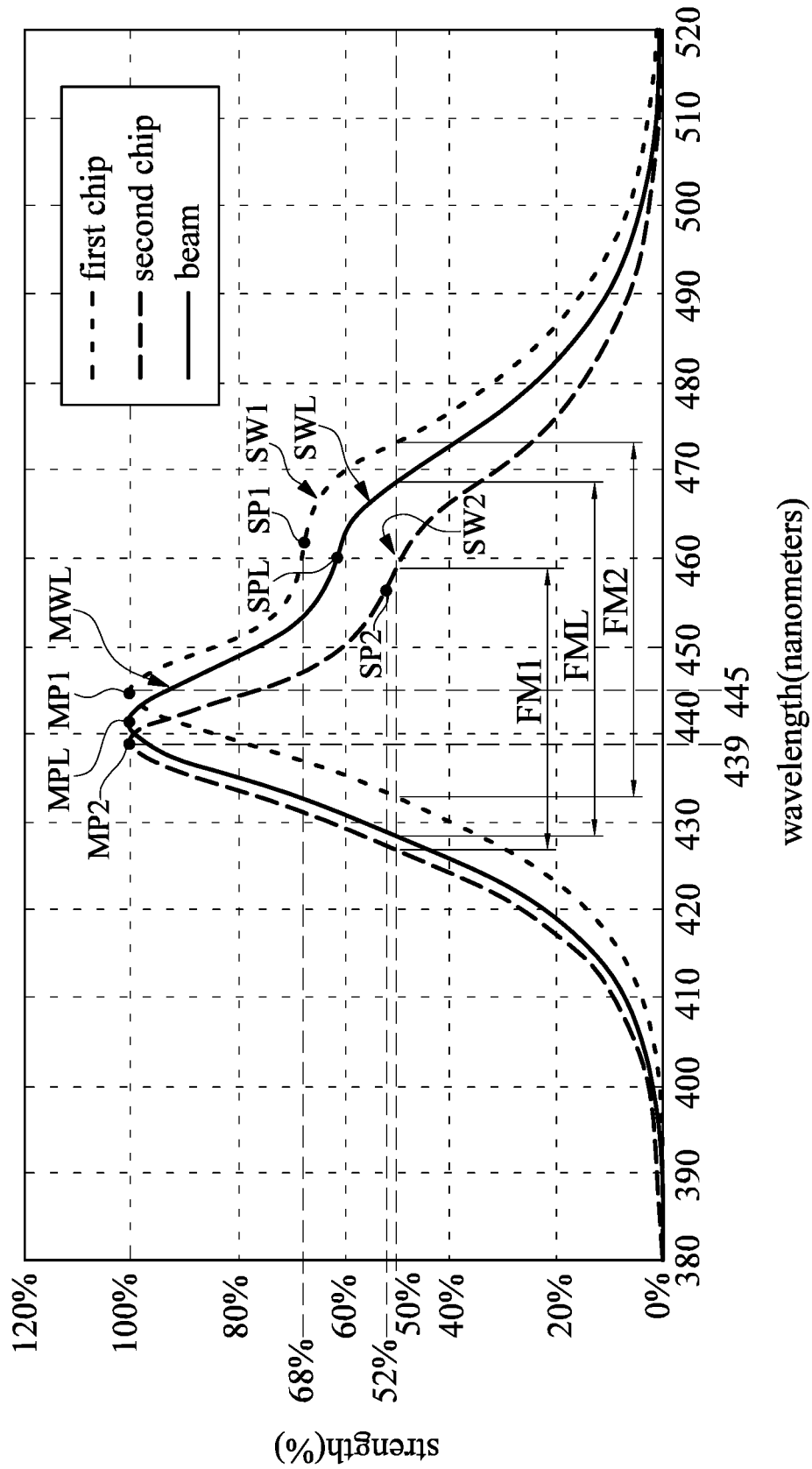
FIG. 4 is a diagram showing each of a light generated by the first chip, a light generated by the second chip, and a beam in a corresponding broad-band blue light spectrum according to a third embodiment of the present disclosure.

Referring to FIG. 4, the present embodiment is similar to the first embodiment, and the similarities between the present embodiment and the first embodiment will not be repeated herein. The differences of the present embodiment from the first embodiment are mainly as follows.

Each of the first chip 110 and the second chip 120 is configured to satisfy the first condition and the second condition different from the first embodiment. The first condition in the present disclosure is that when a difference between the peak wavelength MP1 of the first main wave MW1 and the peak wavelength MP2 of the second main wave MW2 is greater than 2.5 nanometers, the peak wavelength MP1 of the first main wave MW1 and the peak wavelength MP2 of the second main wave MW2 are defined as being dissimilar to each other. The second condition in the present disclosure is that when a difference between the first intensity ratio and the second intensity ratio is greater than 0.1, the first intensity ratio and the second intensity ratio are defined as being dissimilar to each other.

For the convenience of description, an example will be given below, but the present disclosure is not limited thereto. Reference is made to FIG. 4, which is a waveform diagram showing each of a light generated by the first chip 110, a light generated by the second chip 120, and the beam generated by the mixing of the light generated by the first chip 110 and the light generated by the second chip 120 that meet the first condition and the second condition in a corresponding broad-band blue light spectrum. The horizontal axis of the diagram is wavelength (nm), and the vertical axis of the diagram is intensity (%).

Referring to FIG. 4, when each of the first chip 110 and the second chip 120 satisfies the first condition and the second condition, the FWHM FML of the beam is significantly greater than the FWHM FM2 of the second chip 120.

Specifically, when the peak wavelength MP1 of the first chip 110 and the peak wavelength MP2 of the second chip 120 each are located in a section that is within a range from 430 to 455 nanometers, the peak wavelength MP1 of the first main wave MW1 is approximately 445 nanometers, and the peak wavelength MP2 of the second main wave MW2 is approximately 439 nanometers. A difference between the peak wavelength MP1 of the first main wave MW1 and the peak wavelength MP2 of the second main wave MW2 is 6 nanometers and is greater than 2.5 nanometers. In other words, the peak wavelength MP1 of the first main wave MW1 and the peak wavelength MP2 of the second main wave MW2 are defined as being dissimilar to each other according to the first condition. In addition, the peak wavelength MPL of the beam is 441 nanometers, that is, the peak wavelength MPL of the beam is within a range from the peak wavelength MP1 of the first main wave MW1 to the peak wavelength MP2 of the second main wave MW2.

When the first shoulder wave SW1 and the second shoulder wave SW2 are approximately within a range from 445 to 475 nanometers, the intensity of the first shoulder wave SW1 and the intensity of the second shoulder wave SW2 are each within a range from 30% to 90%, and the intensity of the peak wavelength SPL of the beam shoulder wave SWL is within a range from the intensity of the peak wavelength SP1 of the first shoulder wave SW1 to the intensity of the peak wavelength SP2 of the second shoulder wave SW2. In detail, the intensity of the peak wavelength SP1 of the first shoulder wave SW1 is approximately 68%, the intensity of the peak wavelength MP1 of the first main wave MW1 is 100%, the intensity of the peak wavelength SP2 of the second shoulder wave SW2 is approximately 52%, and the intensity of the peak wavelength MP2 of the second main wave MW2 is 100%. In other words, the first intensity ratio is 0.68 and the second intensity ratio is 0.52, so that the difference between the first intensity ratio and the second intensity ratio is 0.16, which is greater than 0.1. Therefore, according to the second condition, the first intensity ratio and the second intensity ratio are defined as being dissimilar to each other. In addition, the first intensity ratio and the second intensity ratio are each within a range from 30% to 90%, that is, within a range from 0.3 to 0.9.

Fourth Embodiment

Referring to FIG. 4, the present embodiment is similar to the first embodiment, and the similarities between the present embodiment and the first embodiment will not be repeated herein. The differences of the present embodiment from the third embodiment are mainly as follows.

Figure 5:
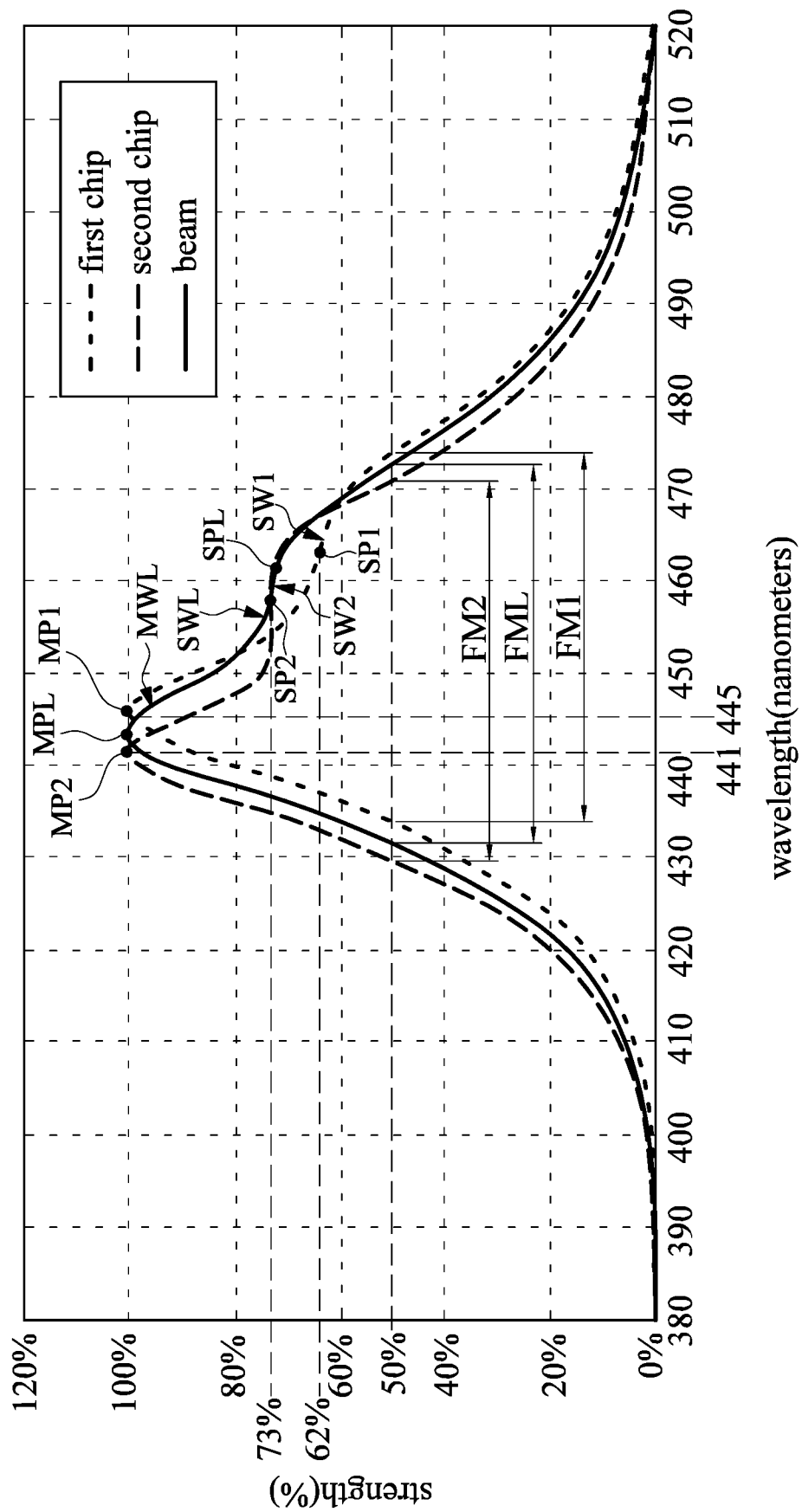
FIG. 5 is a diagram showing each of a light generated by the first chip, a light generated by the second chip, and a beam in a corresponding broad-band blue light spectrum according to a fourth embodiment of the present disclosure.

For the convenience of description, an example will be given below, but the present disclosure is not limited thereto. Reference is made to FIG. 5, which is a waveform diagram showing each of a light generated by the first chip 110, a light generated by the second chip 120, and the beam generated by the mixing of the light generated by the first chip 110 and the light generated by the second chip 120 that meet the first condition and the second condition in a corresponding broad-band blue light spectrum. The horizontal axis of the diagram is wavelength (nm), and the vertical axis of the diagram is intensity (%).

Referring to FIG. 5, when each of the first chip 110 and the second chip 120 satisfies the first condition and the second condition, the FWHM FML of the beam is significantly greater than the FWHM FM2 of the second chip 120.

Specifically, when the peak wavelength MP1 of the first chip 110 and the peak wavelength MP2 of the second chip 120 each are located in a section that is within a range from 430 to 455 nanometers, the peak wavelength MP1 of the first main wave MW1 is approximately 445 nanometers, and the peak wavelength MP2 of the second main wave MW2 is approximately 441 nanometers. A difference between the peak wavelength MP1 of the first main wave MW1 and the peak wavelength MP2 of the second main wave MW2 is 4 nanometers and is greater than 2.5 nanometers. In other words, the peak wavelength MP1 of the first main wave MW1 and the peak wavelength MP2 of the second main wave MW2 are defined as being dissimilar to each other according to the first condition. In addition, the peak wavelength MPL of the beam is approximately 443 nanometers, that is, within a range from the peak wavelength MP1 of the first main wave MW1 to the peak wavelength MP2 of the second main wave MW2.

When the first shoulder wave SW1 and the second shoulder wave SW2 are each within a range from 445 to 475 nanometers, the intensity of the first shoulder wave SW1 and the intensity of the second shoulder wave SW2 are each within a range from 30% to 90%. In detail, the intensity of the peak wavelength SP1 of the first shoulder wave SW1 is approximately 62%, the intensity of the peak wavelength MP1 of the first main wave MW1 is 100%, the intensity of the peak wavelength SP2 of the second shoulder wave SW2 is approximately 73%, and the intensity of the peak wavelength MP2 of the second main wave MW2 is 100%. In other words, the first intensity ratio is 0.62 and the second intensity ratio is 0.73, so that the difference between the first intensity ratio and the second intensity ratio is 0.11, which is greater than 0.1. Therefore, according to the second condition, the first intensity ratio and the second intensity ratio are defined as being dissimilar to each other. In addition, the first intensity ratio and the second intensity ratio are each within a range from 30% to 90%, that is, within a range from 0.3 to 0.9.

Beneficial Effects of the Embodiments

In conclusion, by virtue of "two non-compliant chips (i.e., the first chip and the second chip) that satisfy the first condition and the second condition being grouped together", all the spectrums of each of the beams generated by the light emitting diode package structures of the present disclosure are consistent with each other and the spectrums of the beams are in compliance with qualified specifications. Accordingly, a utilization rate of chips during manufacturing can be increased, and manufacturing costs can be reduced.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A light emitting diode package structure, comprising:
  a first chip having a first main wave and a first shoulder wave on a broad-band blue light spectrum, wherein a peak wavelength of the first main wave has an intensity and a peak wavelength of the first shoulder wave has an intensity that is lower than the intensity of the peak wavelength of the first main wave, and wherein a value derived from dividing the intensity of the peak wavelength of the first shoulder wave by the intensity of the peak wavelength of the first main wave is defined as a first intensity ratio;
  a second chip, wherein a broad-band blue light spectrum of a light generated by the second chip is different from the broad-band blue light spectrum of a light generated by the first chip, and the second chip has a second main wave and a second shoulder wave on the broad-band blue light spectrum, wherein a peak wavelength of the second main wave has an intensity and a peak wavelength of the second shoulder wave has an intensity that is lower than the intensity of the peak wavelength of the second main wave, and wherein a value derived from dividing the intensity of the peak wavelength of the second shoulder wave by the intensity of the peak wavelength of the second main wave is defined as a second intensity ratio; and
  a package body covering the first chip and the second chip;

wherein the light generated by the first chip and the light generated by the second chip are mixed and pass through the package body so as to generate a beam;
wherein each of the first chip and the second chip is configured to satisfy a first condition and a second condition:
the first condition is a difference between the peak wavelength of the first main wave and the peak wavelength of the second main wave being less than or equal to 2.5 nanometers, and
the second condition is a difference between the first intensity ratio and the second intensity ratio being greater than 0.1;
wherein a full width at half maximum (FWHM) of the beam is within a range from an FWHM of the first chip to an FWHM of the second chip.

2. The light emitting diode package structure according to claim 1, wherein the beam has a beam main wave and a beam shoulder wave on the broad-band blue light spectrum; wherein a peak wavelength of the beam main wave has an intensity, and a peak wavelength of the beam shoulder wave has an intensity that is lower than the intensity of the peak wavelength of the beam main wave; wherein a value derived from dividing the intensity of the peak wavelength of the beam shoulder wave by the intensity of the peak wavelength of the beam main wave is defined as a beam intensity ratio that is within a range from the first intensity ratio to the second intensity ratio.

3. The light emitting diode package structure according to claim 1, wherein the peak wavelength of the first shoulder wave and the peak wavelength of the second shoulder wave are each within a range from 445 to 475 nanometers.

4. The light emitting diode package structure according to claim 1, wherein the first intensity ratio and the second intensity ratio are each within a range from 30% to 90%.

5. A light emitting diode package structure, comprising:
a first chip having a first main wave and a first shoulder wave on a broad-band blue light spectrum, wherein a peak wavelength of the first main wave has an intensity and a peak wavelength of the first shoulder wave has an intensity that is lower than the intensity of the peak wavelength of the first main wave, and wherein a value derived from dividing the intensity of the peak wavelength of the first shoulder wave by the intensity of the peak wavelength of the first main wave is defined as a first intensity ratio;
a second chip, wherein a broad-band blue light spectrum of a light generated by the second chip is different from the broad-band blue light spectrum of a light generated by the first chip, and the second chip has a second main wave and a second shoulder wave on the broad-band blue light spectrum, wherein a peak wavelength of the second main wave has an intensity and a peak wavelength of the second shoulder wave has an intensity that is lower than the intensity of the peak wavelength of the second main wave, and wherein a value derived from dividing the intensity of the peak wavelength of the second shoulder wave by the intensity of the peak wavelength of the second main wave is defined as a second intensity ratio; and
a package body covering the first chip and the second chip;
wherein the light generated by the first chip and the light generated by the second chip are mixed and pass through the package body so as to generate a beam;
wherein each of the first chip and the second chip is configured to satisfy a first condition and a second condition:
the first condition is a difference between the peak wavelength of the first main wave and the peak wavelength of the second main wave being greater than 2.5 nanometers, and
the second condition is that when a difference between the first intensity ratio and the second intensity ratio being less than or equal to 0.2;
wherein a full width at half maximum (FWHM) of the beam is at least greater than an FWHM of the first chip or an FWHM of the second chip.

6. The light emitting diode package structure according to claim 5, wherein the beam has a beam main wave on the broad-band blue light spectrum, and wherein a peak wavelength of the beam main wave has an intensity that is within a range from the intensity of the peak wavelength of the first main wave to the intensity of the peak wavelength of the second main wave.

7. The light emitting diode package structure according to claim 6, wherein the beam has a beam shoulder wave on the broad-band blue light spectrum; wherein a peak wavelength of the beam shoulder wave has an intensity that is lower than the intensity of the peak wavelength of the beam main wave, and the intensity of the peak wavelength of the beam shoulder wave is greater than the intensity of the peak wavelength of the first shoulder wave and the intensity of the peak wavelength of the second shoulder wave.

8. The light emitting diode package structure according to claim 5, wherein intensity of the peak wavelength of the first main wave and the peak wavelength of the second main wave are each within a range from 430 to 455 nanometers.

9. The light emitting diode package structure according to claim 5, wherein the first intensity ratio and the second intensity ratio are each within a range from 30% to 90%.

10. A light emitting diode package structure, comprising:
a first chip having a first main wave and a first shoulder wave on a broad-band blue light spectrum, wherein a peak wavelength of the first main wave has an intensity and a peak wavelength of the first shoulder wave has an intensity that is lower than the intensity of the peak wavelength of the first main wave, and wherein a value derived from dividing the intensity of the peak wavelength of the first shoulder wave by the intensity of the peak wavelength of the first main wave is defined as a first intensity ratio;
a second chip, wherein a broad-band blue light spectrum of a light generated by the second chip is different from the broad-band blue light spectrum of a light generated by the first chip, and the second chip has a second main wave and a second shoulder wave on the broad-band blue light spectrum, wherein a peak wavelength of the second main wave has an intensity and a peak wavelength of the second shoulder wave has an intensity that is lower than the intensity of the peak wavelength of the second main wave, and wherein a value derived from dividing the intensity of the peak wavelength of the second shoulder wave by the intensity of the peak wavelength of the second main wave is defined as a second intensity ratio; and
a package body covering the first chip and the second chip;
wherein the light generated by the first chip and the light generated by the second chip are mixed and pass through the package body so as to generate a beam;

wherein each of the first chip and the second chip is configured to satisfy a first condition and a second condition:
the first condition is a difference between the peak wavelength of the first main wave and the peak wavelength of the second main wave being greater than 2.5 nanometers, and
the second condition is a difference between the first intensity ratio and the second intensity ratio being greater than 0.1;
wherein a full width at half maximum (FWHM) of the beam is at least greater than an FWHM of the first chip or an FWHM of the second chip.

11. The light emitting diode package structure according to claim 10, wherein the beam has a beam main wave and a beam shoulder wave on the broad-band blue light spectrum; wherein a peak wavelength of the beam main wave has an intensity, and a peak wavelength of the beam shoulder wave has an intensity that is lower than the intensity of the peak wavelength of the beam main wave; wherein a value derived from dividing the intensity of the peak wavelength of the beam shoulder wave by the intensity of the peak wavelength of the beam main wave is defined as a beam intensity ratio that is within a range from the first intensity ratio to the second intensity ratio.

12. The light emitting diode package structure according to claim 11, wherein the intensity of the peak wavelength of the beam main wave is within a range from the intensity of the peak wavelength of the first main wave to the intensity of the peak wavelength of the second main wave.

13. The light emitting diode package structure according to claim 10, wherein the peak wavelength of the first main wave and the peak wavelength of the second main wave are each within a range from 430 to 455 nanometers.

14. A light emitting diode package structure, comprising:
a first chip having a first main wave and a first shoulder wave on a broad-band blue light spectrum, wherein a peak wavelength of the first main wave has an intensity and a peak wavelength of the first shoulder wave has an intensity that is lower than the intensity of the peak wavelength of the first main wave, and wherein a value derived from dividing the intensity of the peak wavelength of the first shoulder wave by the intensity of the peak wavelength of the first main wave is defined as a first intensity ratio;
a second chip, wherein a broad-band blue light spectrum of a light generated by the second chip is different from the broad-band blue light spectrum of a light generated by the first chip, and the second chip has a second main wave and a second shoulder wave on the broad-band blue light spectrum, wherein a peak wavelength of the second main wave has an intensity and a peak wavelength of the second shoulder wave has an intensity that is lower than the intensity of the peak wavelength of the second main wave, and wherein a value derived from dividing the intensity of the peak wavelength of the second shoulder wave by the intensity of the peak wavelength of the second main wave is defined as a second intensity ratio; and
a package body covering the first chip and the second chip;
wherein the light generated by the first chip and the light generated by the second chip are mixed and pass through the package body so as to generate a beam;
wherein each of the first chip and the second chip is configured to at least satisfy a first condition or a second condition:
the first condition is a difference between the peak wavelength of the first main wave and the peak wavelength of the second main wave being greater than 2.5 nanometers, and
the second condition is that there is a difference between the first intensity ratio and the second intensity ratio.

15. The light emitting diode package structure according to claim 14, wherein, when each of the first chip and the second chip does not satisfy the first condition, the difference between the first intensity ratio and the second intensity ratio is greater than 0.1.

16. The light emitting diode package structure according to claim 15, wherein the beam has a beam main wave and a beam shoulder wave on the broad-band blue light spectrum; wherein a peak wavelength of the beam main wave has an intensity, and a peak wavelength of the beam shoulder wave has an intensity that is lower than the intensity of the peak wavelength of the beam main wave; wherein a value derived from dividing the intensity of the peak wavelength of the beam shoulder wave by the intensity of the peak wavelength of the beam main wave is defined as a beam intensity ratio; wherein, when each of the first chip and the second chip satisfies the second condition, the beam intensity ratio is within a range from the first intensity ratio to the second intensity ratio.

17. The light emitting diode package structure according to claim 15, wherein, when each of the first chip and the second chip satisfies the second condition, a full width at half maximum (FWHM) of the beam is within a range from an FWHM of the first chip to an FWHM of the second chip.

18. The light emitting diode package structure according to claim 14, wherein, when each of the first chip and the second chip satisfies the first condition, each of the first chip and the second chip needs to further satisfy an advanced condition; wherein the advanced condition is that the difference between the first intensity ratio and the second intensity ratio is less than or equal to 0.2, so that a full width at half maximum (FWHM) of the beam is at least greater than an FWHM of the first chip or an FWHM of the second chip.

19. The light emitting diode package structure according to claim 14, wherein the beam has a beam main wave on the broad-band blue light spectrum; wherein a peak wavelength of the beam main wave has an intensity; wherein, when each of the first chip and the second chip satisfies the first condition, each of the first chip and the second chip needs to further satisfy an advanced condition; wherein the advanced condition is that the difference between the first intensity ratio and the second intensity ratio is greater than 0.1, so that the intensity of the peak wavelength of the beam main wave is within a range from the intensity of the peak wavelength of the first main wave to the intensity of the peak wavelength of the second main wave.

20. The light emitting diode package structure according to claim 14, wherein a wavelength of the intensity of the peak wavelength of the first main wave and a wavelength of the intensity of the peak wavelength of the second main wave are each within a range from 430 to 455 nanometers.

* * * * *